(12) United States Patent
Wang et al.

(10) Patent No.: US 9,054,645 B1
(45) Date of Patent: Jun. 9, 2015

(54) PROGRAMMABLE RECEIVERS IMPLEMENTED IN AN INTEGRATED CIRCUIT DEVICE

(71) Applicant: Xilinx, Inc., San Jose, CA (US)

(72) Inventors: Xiaobao Wang, Cupertino, CA (US); Arvind R. Bomdica, Palo Alto, CA (US); Vipul D. Badoni, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/081,832

(22) Filed: Nov. 15, 2013

(51) Int. Cl.
*H03G 3/30* (2006.01)
*H03K 19/173* (2006.01)
*H03F 1/02* (2006.01)
*H03F 3/45* (2006.01)

(52) U.S. Cl.
CPC ............ *H03F 1/0211* (2013.01); *H03F 1/0205* (2013.01); *H03F 3/45076* (2013.01)

(58) Field of Classification Search
USPC .................. 326/38, 82, 83, 86; 330/129, 130
See application file for complete search history.

(56) References Cited

U.S. PATENT DOCUMENTS

| | | | |
|---|---|---|---|
| 8,548,071 B2 | 10/2013 | Collins | |
| 2007/0200624 A1* | 8/2007 | Chen et al. | 330/129 |

\* cited by examiner

*Primary Examiner* — Daniel D Chang
(74) *Attorney, Agent, or Firm* — John J. King

(57) ABSTRACT

A programmable receiver implemented in an integrated circuit device is described. The programmable receiver comprises a pre-amplifier circuit coupled to receive an input signal, the pre-amplifier circuit having a programmable current source; and an amplifier circuit coupled to receive an output of the pre-amplifier circuit; wherein the programmable current source is coupled to receive a control signal to enable the receiver to be switched between a high performance mode and a low performance mode. A method of implementing a programmable receiver in an integrated circuit is also described.

18 Claims, 8 Drawing Sheets

PROGRAMMABLE RECEIVERS IMPLEMENTED IN AN INTEGRATED CIRCUIT DEVICE

TECHNICAL FIELD

The various circuits relate generally to integrated circuit devices, and in particular to programmable receivers and methods of implementing a programmable receiver in an integrated circuit device.

BACKGROUND

Data transmission is an important part of many integrated circuits and systems having integrated circuits. Data is typically communicated with an integrated circuit by way on an input/output (I/O) port. Data may be communicated in a system in different formats and according to a variety data communication protocols. However, a receiver of an integrated circuit can consume significant power and can have a significant effect on the operation of an integrated circuit having the receiver. Accordingly, circuit designers are always looking for ways to improve the operation and performance of a receiver in an integrated circuit device.

It is becoming more difficult to implement General Purpose Input/Output (GPIO) receiver designs that meet the design constraints of conventional high speed, low power, low signal swing applications, such as double data rate (DDR4), mobile industry processor interface (MIPI), sub-low voltage differential signaling (sub-LVDS), etc., which have low input signal swing. Due to mismatches in the circuit layout and random process variations of integrated circuit devices, the input offset voltage of a typical receiver can be at such a high level that it reduces the net input swing of the receiver to an unacceptably low level. It is hard to meet 3.2 Gbps data rate of a DDR4 interface with 20 mV input signal swing using existing receiver designs due to their limited input sensitivity, bandwidth, and high pad capacitance. Further, receivers having reduced power consumption and improved performance are beneficial when implemented in integrated circuit devices.

SUMMARY

A programmable receiver implemented in an integrated circuit device is described. The programmable receiver comprises a pre-amplifier circuit coupled to receive an input signal, the pre-amplifier circuit having a programmable current source; and an amplifier circuit coupled to receive an output of the pre-amplifier circuit; wherein the programmable current source is coupled to receive a control signal to enable the receiver to be switched between a high performance mode and a low performance mode.

Another programmable receiver implemented in an integrated circuit device comprises an amplifier circuit coupled to receive an input signal; and a detection circuit coupled to an output of the amplifier circuit; wherein the detection circuit generates a control signal coupled to the amplifier circuit to modify an offset of the input signal.

A method of implementing a programmable receiver in an integrated circuit device is also described. The method comprises receiving an input signal to be amplified at inputs of an amplifier circuit; and detecting an output of the amplifier circuit; coupling a control signal to the amplifier circuit; and modifying an offset of the input signal coupled to the amplifier circuit in response to the control signal.

DETAILED DESCRIPTION

Figure 1:
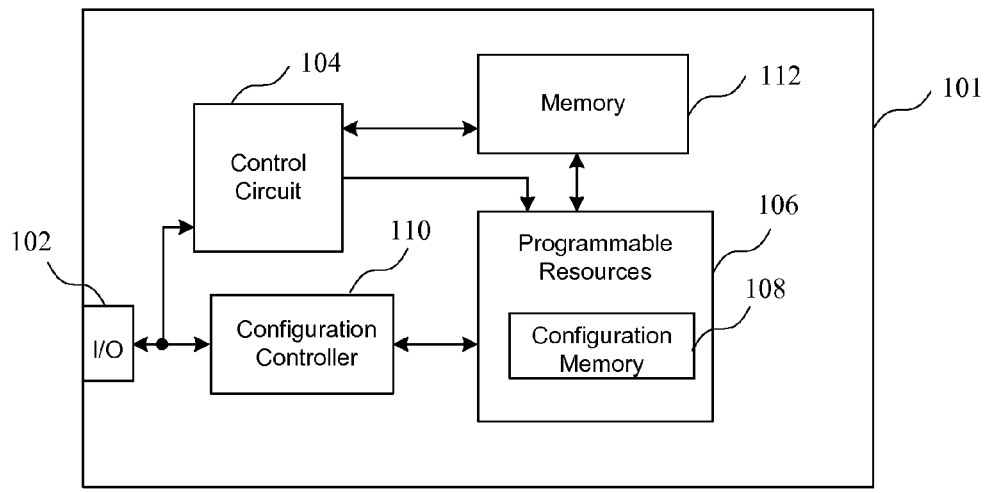
FIG. 1 is a block diagram of an integrated circuit device adapted to receive data.

The various circuits and methods set forth below relate to circuits for and methods of implementing a programmable receiver in an integrated circuit device. GPIO receiver designs are becoming more challenging to meet the design constraints of today's high speed, low power, low signal swing (e.g. as low as 50 mV). Because an input offset voltage of a typical receiver is around 30 mV, the net input swing at the receiver is as low as 20 mV (i.e. 50 mV-30 mV), making it hard to meet the 3.2 Gbps data rate of a DDR4 interface for example. The circuits and methods set forth below disclose advantageous programmable receivers which provide the required level of system performance with reduced power consumption for high performance communication interfaces, such as DDR3/4, sub-LVDS, and MIPI communication interfaces. The receivers can be configured as either reference voltage-based or true differential receivers, with features including programmable high performance/low power modes, programmable offset cancellation/duty cycle correction, and active linear equalization. A state machine may be implemented and control the receiver based on the results of a detector detecting the duty cycle of an input signal. A receiver may also be capable of conditioning a signal at the receiver output to be sampled at the capture register with optimal sampling window without dedicated duty cycle correction circuits, therefore advantageously reducing receiver path insertion delay and saving power and die area.

Accordingly, the circuits and methods provide a versatile, high-performance, low-power receiver for a GPIO, such as a GPIO in a Field Programmable Gate Array (FPGA) for example. The circuits have many features such as programmable power, programmable equalization, programmable true differential or reference voltage-based inputs, offset cancellation and duty cycle correction which are not available in conventional devices. The receiver also has high bandwidth due to resistor-capacitor (RC) degeneration at the front-end pre-amplifier which improves receiver ISI.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Turning first to FIG. 1, a block diagram of an integrated circuit device adapted to receive data is shown. In particular, an input/output port 102 is coupled to a control circuit 104 controls programmable resources 106 having configuration memory 108. Configuration data, which will be described in more detail below in reference to FIGS. 7-9, may be provided to the configuration memory 108 by a configuration controller 110. A separate memory 112, which may be a non-volatile memory for example, may be coupled to the control circuit 104 and the programmable resources 206.

Figure 2:
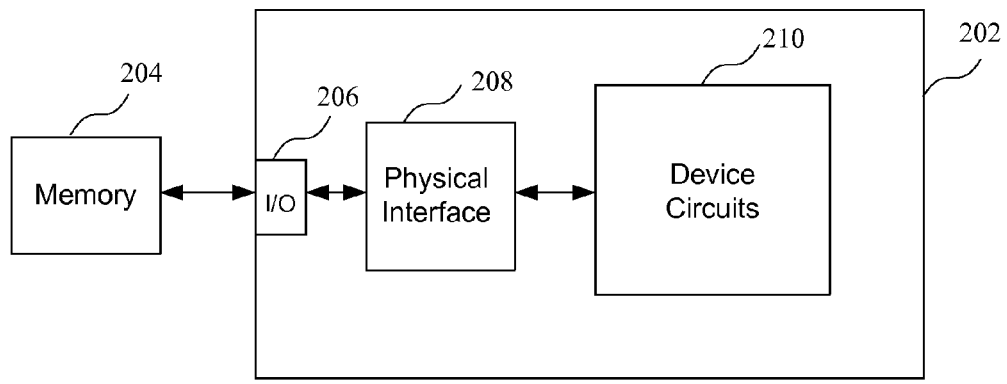
FIG. 2 is a block diagram of a circuit having an integrated device connected to a memory device.

Turning now to FIG. 2, a block diagram of a circuit having an integrated device connected to a memory device is shown. In particular, an integrated circuit 202, which may include circuits of the integrated circuit of FIG. 1 for example, is coupled to a memory 204 to enable routing data from the memory 204 to the integrated circuit 204. The integrated circuit 202 comprises an input/output port 206 coupled to a physical interface 208 enabling the transfer of data to device circuits 210. As will be described in more detail below, the input/output port 206 and the physical interface 208 enable the transfer of data according to certain protocols, such as a DDR protocol for example.

Figure 3:
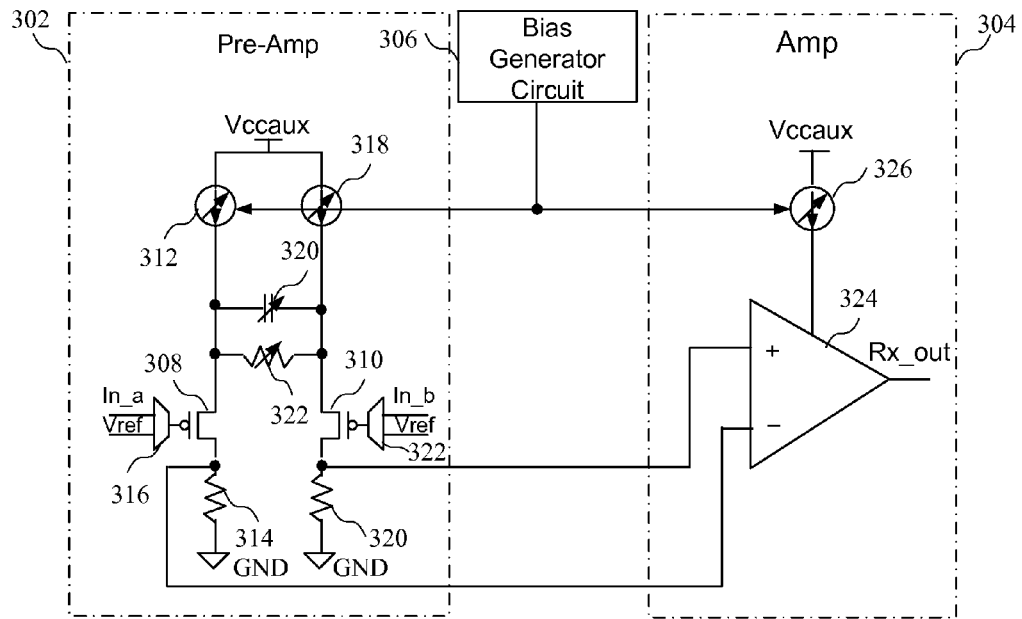
FIG. 3 is a block diagram of an integrated circuit device having a programmable receiver adapted to be switched between a high performance mode and a low performance mode.

Turning now to FIG. 3, a block diagram of an integrated circuit device having a programmable receiver adapted to be switched between a high performance mode and a low performance mode is shown. The circuit of FIG. 3 comprises a pre-amplifier circuit 302 coupled to an amplifier circuit 304, shown here as a differential-to-CMOS amplifier which converts an analog signal from the pre-amplifier to CMOS level signal. The pre-amplifier circuit 302 and the amplifier circuit 304 are coupled to a bias generation circuit 306 enabling switching between a performance mode and a low power mode. The pre-amplifier 302 comprises a first transistor 308 and a second transistor 310 enabling first and second current paths between a reference voltage (Vccaux) and ground (GND) to generate inputs to the amplifier circuit 304 as shown. The first path also includes a controllable current source 312 and a resistor 314 coupled in series with the transistor 308 as shown. The gate of the transistor 308 is coupled to a selection circuit 316, shown here as a multiplexer, which enables the selection of a differential input (In_a) or a reference voltage (Vref). Similarly, the second path includes a controllable current source 318 and a resistor 320 coupled in series with the transistor 310. The gate of the transistor 310 is coupled to a selection circuit 322 which enables the selection of a differential input (In_b) or the reference voltage (Vref).

The amplifier circuit 304 comprises an amplifier 324 which is coupled to receive the output of the pre-amplifier circuit 302, at nodes above the resistors 314 and 320 as shown. A current source 326, also controlled by a control signal from the bias generation circuit 306, provides an operating current to the amplifier 324. As with the pre-amplifier circuit 302, the current provided to the amplifier 324 by the current source 326 is also controlled to control the power used by the programmable receiver. While the bias current generator may generate a current for a low performance mode (i.e. low power mode) and a high performance (i.e. a high power mode), it should be understood that many other levels of performance based upon corresponding power settings could be used.

The pre-amplifier may be implemented as a continuous time linear equalizer (CTLE) to provide high bandwidth due to its resistor-capacitor (RC) source degeneration structure. Adjusting R and C values associated with the amplifier provides different levels of equalization for high frequency signal compensation due to channel loss and/or input signal slew rate degradation due to high pad capacitance.

Figure 4:
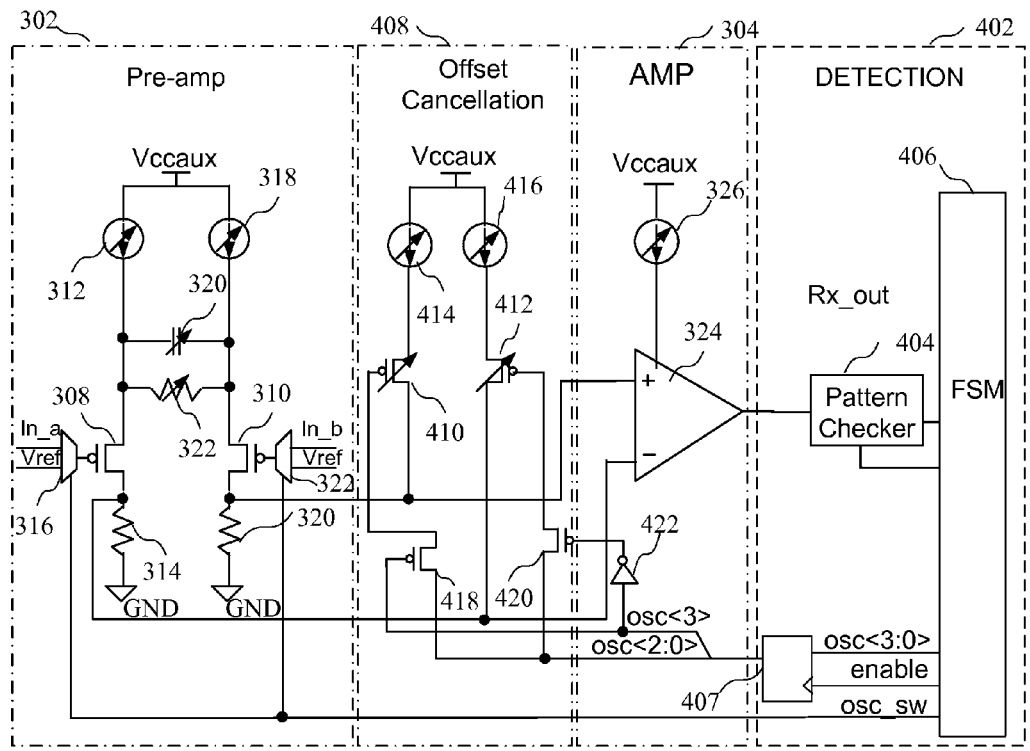
FIG. 4 is a block diagram of a circuit enabling the determination of an offset in a received signal.

Turning now to FIG. 4, a block diagram of a circuit enabling the determination of an offset in a received signal is shown. The circuit of FIG. 4 includes the pre-amplifier 302 and the amplifier circuit 304 of FIG. 3, and further includes the detection circuit 402. An output (Rx_out) of the amplifier circuit 304 is coupled to an input of the detection circuit 402, and more particularly to a pattern checker circuit 404. The pattern checker circuit 404 interfaces with a finite state machine (FSM) 406. The detection circuit 402 also includes a register 407 which generates an offset bias control signal osc<3:0> which controls the currents of the offset cancellation circuit, as will be described in more detail below. The detection circuit 402 may be implemented in a processor or other circuitry of the integrated circuit. The FSM 408 provides control signals to the amplifier for advantageously improving the performance of the amplifier.

According to the implementation of FIG. 4, the detection circuit 402 enables offset correction by providing control signals to an offset cancellation circuit 408. The offset cancellation circuit 408 comprises first and second transistors 410 and 412 of corresponding control paths having current sources 414 and 416 and coupled to the inputs of the amplifier 324. The offset cancellation circuit generates the offset bias control signal osc<3:0>, where osc<2:0> represents one of eight voltage levels which may be applied to the gate of one of the transistors 410 and 412, and osc<3> selects with whether transistor 410 and 412 receives the bias control signal. Accordingly, pass transistors are implemented to provide the voltage level designated by the osc<2:0> signal to the gate of the transistors 410 and 412 by pass transistors 418 and 420, where the gates of the transistors 418 and 420 are controlled by the osc<3> signal and the inverted osc<3> signal generated at the output of an inverter 422, respectively. By way of example, the offset may vary by 5 millivolt intervals from 0 to 35 millivolts depending upon the value of ocs<2:0>.

Input offset of the programmable receiver can be cancelled by controlling the current sources of the receiver using the offset cancellation circuit 408. More particularly, the two inputs of receiver are connected to Vref through the input multiplexers 316 and 322 by setting a control setting (osc_sw) equal to 1. The receiver output "Rx_out" is monitored by a state machine, where the state machine sends the codes to the offset cancellation circuit to adjust the current through transistors 308 and 310 until "Rx_out" transitions from logic 1 to logic 0 or from logic 0 to logic 1. The pattern checker 404, which functions as a digital counter/filter is used to filter out the noise and/or jitter from the Rx_out signal. The counter/filter and the state machine can be implemented either inside the IOB or other circuitry of the integrated circuit device, such as in FPGA fabric which will be described in detail in reference to FIGS. 7 and 8. When osc_sw from the finite state machine 406 is high, the receiver is in offset cancellation mode, and an offset bias signal or code (osc<3:0>) from the state machine is provided to control the amount of offset in the received input signal. When offset cancellation is done, osc_sw signal is switched from high to low, the osc<3:0> signal is latched into the receiver, and receiver is ready for normal operation.

Accordingly, in order to determine the optimum offset bias signal to eliminate any undesirable offset, the offset bias control signal can be varied (through each of the 8 levels according to the 4-bit osc<3:0> code) to advantageously determine the correct offset code to ensure that the received signal is at the correct voltage level. As set forth above, an input offset voltage of a typical receiver of approximately 30 mV can result in a net input swing at the receiver that is as low as 20 mV (i.e. 50 mV-30 mV). Therefore, by eliminating any undesirable offset, the receiver will provided improved performance and accuracy.

Figure 5:
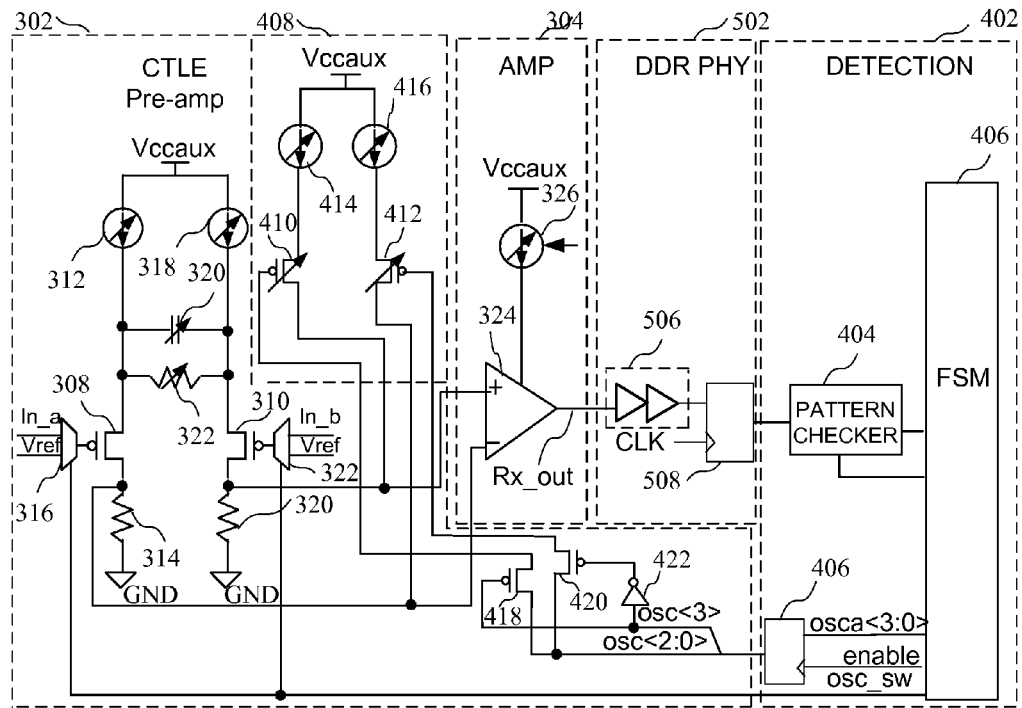
FIG. 5 is a block diagram of a circuit enabling duty cycle control.

Turning now to FIG. 5, a block diagram of a circuit enabling duty cycle control is shown. That is, rather than adjusting bias currents to the amplifier to control an undesirable offset of the input signal, a duty cycle control (DCC) circuit (which is implemented using the same circuit as the offset cancellation circuit 408) can be implemented to maintain the correct duty cycle of the circuit, such as a DDR circuit of FIG. 5 (which has a delay buffer 506 and a register 508 between the amplifier circuit 304 and the detection circuit 402). That is, the offset cancellation circuit built into the receiver can also be used for duty cycle correction, eliminating the need for dedicated DCC circuits as required in conventional devices. Typically, duty cycle distortion comes from multiple sources such as input signal, the receiver itself, and buffer/delay chain/logic between the receiver and a capture FF. Because the duty cycle of the Rx_out signal from the receiver is dependent on the input offset voltage, some offset can be purposely introduced to the receiver (with some input signal voltage noise margin loss) to accomplish ideal signal duty cycle at the input of capture FF to maximize the data sampling window.

For example, a training pattern such as 1010 . . . or 11001100 . . . can be sent to the receiver, then the phase of the clock signal (CLK) provided to the capture FF (i.e. register 508) is moved to measure the sampling window of the incoming signal. If the signal has 50-50 duty cycle, then the number of 1's and 0's at the capture FF output (monitored by pattern check circuit 404) are balanced. The finite state machine adjusts the offset bias control signal (i.e. the osc<3:0> code) until the optimal balance at the capture FF is achieved. The advantage of this DCC implementation compared to conventional devices is that it does not need extra DCC circuits in the signal path which add both insertion delay and jitter and have power and die size penalties.

Figure 6:
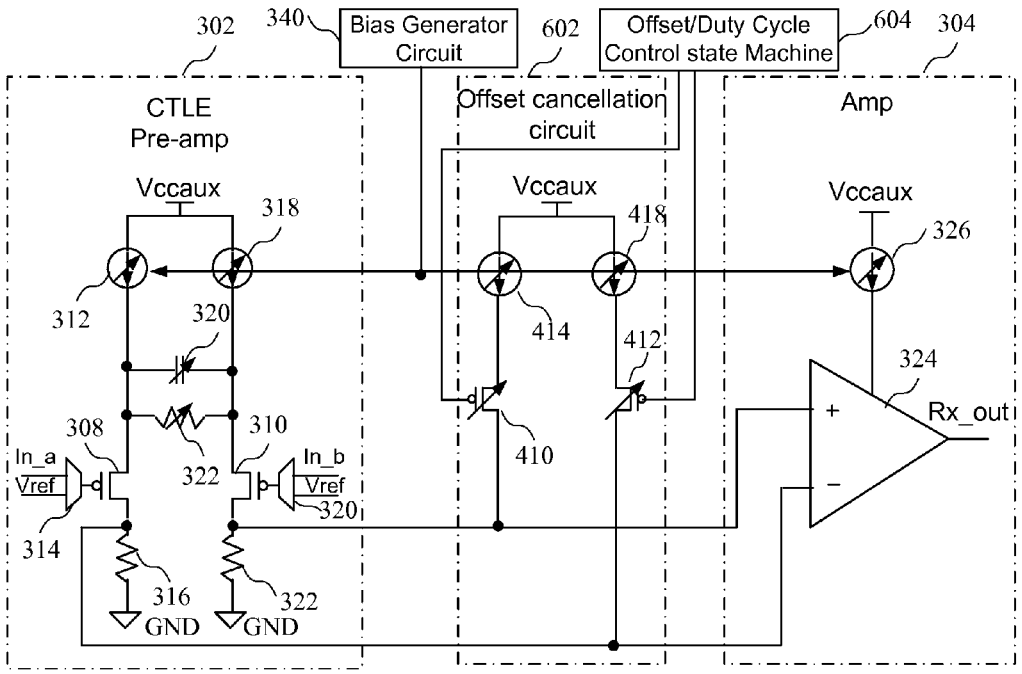
FIG. 6 is a block diagram of a circuit having both power mode control and offset/duty cycle control.

Turning now to FIG. 6, a block diagram of a circuit having both power mode control and offset/duty cycle control is shown. That is, the circuit of FIG. 6 includes both power control as described in reference to FIG. 3, and a circuit for enabling one of offset control or duty cycle control. That is, it should be understood that an attempt to adjust the duty cycle of an input signal may change the offset of the input signal in an undesirable way. Therefore, it must be determined whether offset control or duty cycle control is desired. Accordingly, the circuit of FIG. 6 includes three main blocks including the pre-amplifier 302 having programmable bias currents and equalization levels. For high performance, the bias currents are set at higher value, and for low power applications, the bias currents are set at lower value. An offset/duty cycle control circuit 602, which may be digital binary-weighted offset/duty cycle adjustment circuit controlled by state machine, may be implemented between the pre-amplifier 302 and the amplifier circuit 304. The Offset/Duty Cycle Control State Machine 604 will provide either offset control or duty cycle control based upon the use of the amplifier.

The various circuits and methods as set forth above advantageously overcome problems of conventional devices. While conventional implement input transistors having a larger size to reduce the input offset voltage, such changes undesirably increase the input pad capacitance (where the bandwidth of the receiver is limited by the load capacitance at node). Other conventional circuits increase the input sensitivity of the receiver (i.e. gain) by increasing the output impedance of some transistors. However, a higher output impedance reduces the receiver bandwidth. Conventional receiver circuits also do not have equalization to compensate for signal slew rate degradation due to channel high frequency signal loss and high pad capacitance, and do not have programmable power capabilities to tradeoff between performance and power. Accordingly, the circuits and the methods set forth above advantageously overcome the limitations of conventional receiver devices.

Figure 7:
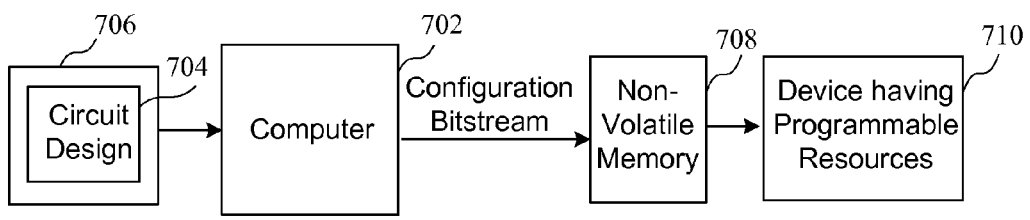
FIG. 7 is a block diagram of system for programming an integrated circuit device.

Turning now to FIG. 7, a block diagram of system for programming an integrated circuit device is shown. In particular, a computer 702 is coupled to receive a circuit design 704 from a memory 706, and generates a configuration bitstream which is stored in the non-volatile memory 706. As will be described in more detail below, the circuit design may be a high level design, such as a circuit design defined in a hardware description language (HDL). Also, the computer may be configured to run software that generates a configuration bitstream which is stored in the non-volatile memory 708 and provided to an integrated circuit 710 which may be a programmable integrated circuit, such as the integrated circuit described below in FIG. 8. As will be described in more detail below, bit of the configuration bitstream are used to configure programmable resources of the integrated circuit.

Figure 8:
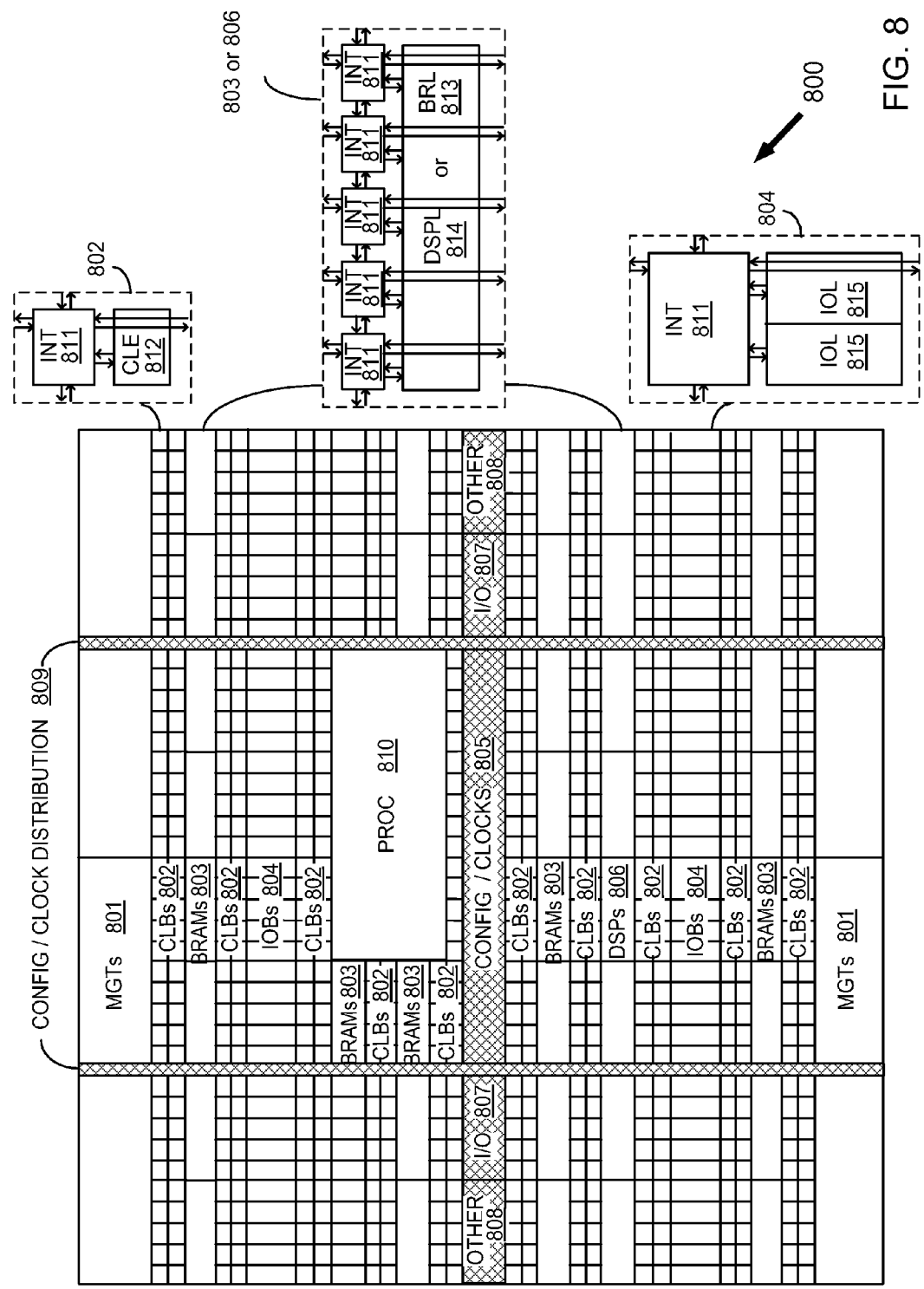
FIG. 8 is a block diagram of an integrated circuit having programmable resources.

Turning now to FIG. 8, a block diagram of an integrated circuit having programmable resources is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 8 comprises an FPGA architecture 800 having a large number of different programmable tiles including multi-gigabit transceivers (MGTs) 801, CLBs 802, random access memory blocks (BRAMs) 803, input/output blocks (IOBs) 804, configuration and clocking logic (CONFIG/CLOCKS) 805, digital signal processing blocks (DSPs) 806, specialized input/output blocks (I/O) 807 (e.g., configuration ports and clock ports), and other programmable logic 908 such as digital clock managers, analog-to-digital converters, system monitoring logic, and so forth. Some FPGAs also include dedicated processor blocks (PROC) 810, which may be used to implement a software application, for example.

In some FPGAs, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA. The programmable interconnect element 811 also includes the connections to and from the programmable logic element within the same tile, as shown by the examples included at the top of FIG. 8.

For example, a CLB 802 may include a configurable logic element (CLE) 812 that may be programmed to implement user logic plus a single programmable interconnect element 811. A BRAM 803 may include a BRAM logic element (BRL) 813 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 806 may include a DSP logic element (DSPL) 814 in addition to an appropriate number of programmable interconnect elements. An IOB 804 may include, for example, two instances of an input/output logic element (IOL) 815 in addition to one instance of the programmable interconnect element 811. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 909 extending from this column are used to distribute the clocks and configuration signals across the breadth of the FPGA. Some FPGAs utilizing the architecture illustrated in FIG. 8 include additional logic blocks that disrupt the regular columnar structure making up a large part of the FPGA. The additional logic blocks may be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear in order to facilitate the efficient implementation of user logic. While the implementation of FIG. 8 relates to an integrated circuit having programmable resources, it should be understood that the circuits and methods set forth in more detail below could be implemented in any type of ASIC.

Figure 9:
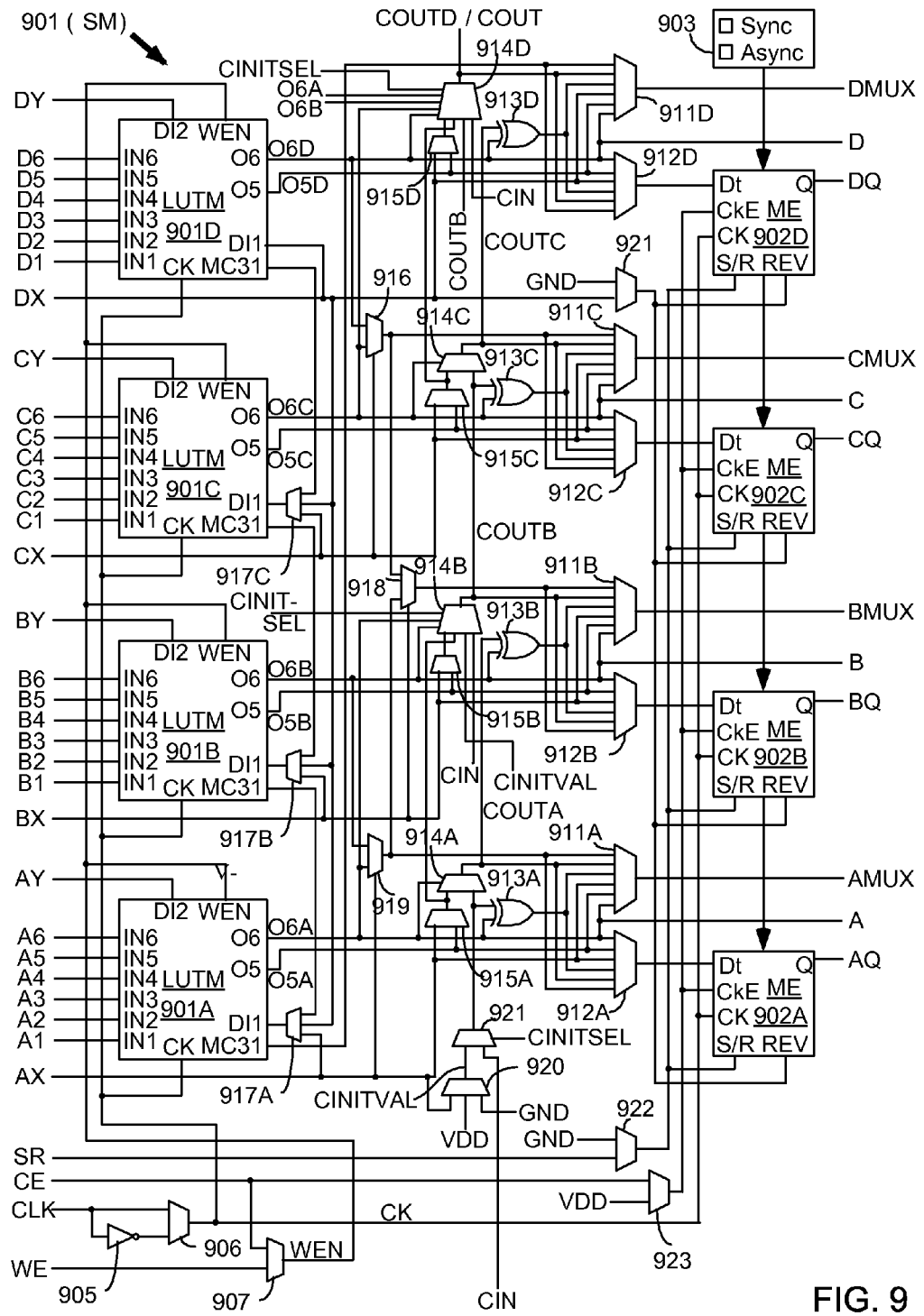
FIG. 9 is a block diagram of a configurable logic element of the integrated circuit of FIG. 8.

Turning now to FIG. 9, a block diagram of a configurable logic element is shown. In particular, FIG. 9 illustrates in simplified form a configurable logic element of a configuration logic block 802 of FIG. 8. In the implementation of FIG. 9, slice M 901 includes four lookup tables (LUTMs) 901A-901D, each driven by six LUT data input terminals A1-A6, B1-B6, C1-C6, and D1-D6 and each providing two LUT output signals O5 and O6. The O6 output terminals from LUTs 901A-901D drive slice output terminals A-D, respectively. The LUT data input signals are supplied by the FPGA interconnect structure via input multiplexers, which may be implemented by programmable interconnect element 911, and the LUT output signals are also supplied to the interconnect structure. Slice M also includes: output select multiplexers 911A-911D driving output terminals AMUX-DMUX; multiplexers 912A-912D driving the data input terminals of memory elements 902A-902D; combinational multiplexers 916, 918, and 919; bounce multiplexer circuits 922-923; a circuit represented by inverter 905 and multiplexer 806 (which together provide an optional inversion on the input clock path); and carry logic having multiplexers 914A-814D, 915A-815D, 920-921 and exclusive OR gates 913A-913D. All of these elements are coupled together as shown in FIG. 9. Where select inputs are not shown for the multiplexers illustrated in FIG. 9, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 9 for clarity, as well as from other selected figures herein.

In the pictured implementation, each memory element 902A-902D may be programmed to function as a synchronous or asynchronous flip-flop or latch. The selection between synchronous and asynchronous functionality is made for all four memory elements in a slice by programming Sync/Asynch selection circuit 903. When a memory element is programmed so that the S/R (set/reset) input signal provides a set function, the REV input terminal provides the reset function. When the memory element is programmed so that the S/R input signal provides a reset function, the REV input terminal provides the set function. Memory elements 902A-902D are clocked by a clock signal CK, which may be provided by a global clock network or by the interconnect structure, for example. Such programmable memory elements are well known in the art of FPGA design. Each memory element 902A-902D provides a registered output signal AQ-DQ to the interconnect structure. Because each LUT 901A-901D provides two output signals, O5 and O6, the LUT may be configured to function as two 5-input LUTs with five shared input signals (IN1-IN5), or as one 6-input LUT having input signals IN1-IN6.

In the implementation of FIG. 9, each LUTM 901A-901D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 917A-917C for LUTs 901A-901C), or to the two 32-bit RAMs via input terminals DI1 and DI2. RAM write operations in the LUT RAMs are controlled by clock signal CK from multiplexer 906 and by write enable signal WEN from multiplexer 907, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 901A may also be provided to the general interconnect structure for shift register chaining, via output select multiplexer 911D and CLE output terminal DMUX. Accordingly, the circuits and methods set forth above may be implemented in a device such as the devices of FIGS. 8 and 9, or any other suitable device.

Figure 10:
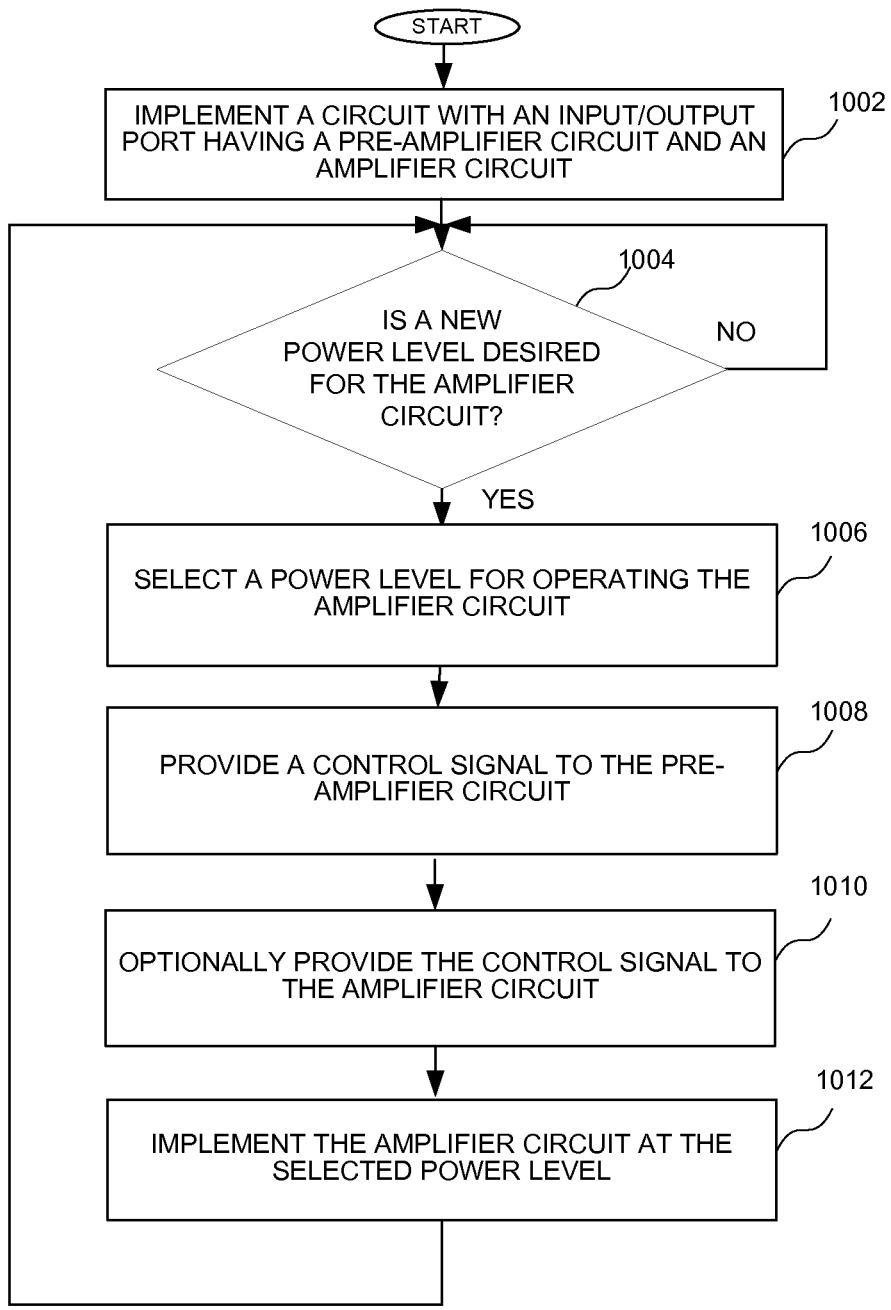
FIG. 10 is a flow chart showing a method of implementing a programmable receiver in an integrated circuit.

Turning now to FIG. 10, a flow chart shows a method of implementing a programmable receiver in an integrated circuit. A circuit is implemented with an input/output port having a pre-amplifier circuit and an amplifier circuit at a block 1002. It is then determined whether a new power level is desired for the amplifier circuit at a block 1004. A power level is selected for operating the amplifier circuit at a block 1006. A control signal is provided to the pre-amplifier circuit at a block 1008. The control signal is optionally provided to the amplifier circuit at a block 1010. The amplifier circuit is then implemented at the selected power level at a block 1012.

Figure 11:
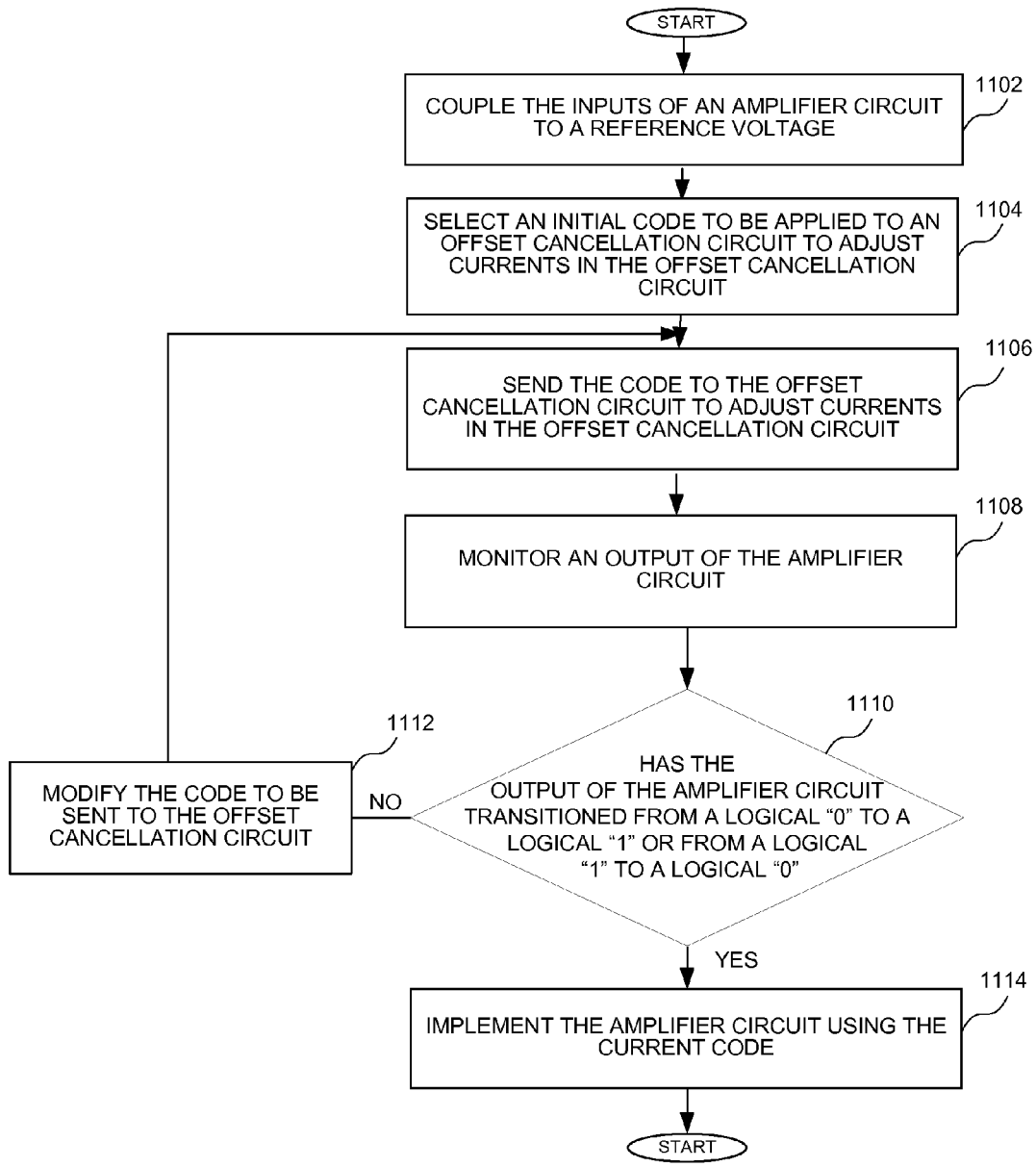
FIG. 11 is a flow chart showing a method of adjusting an offset of an input signal to a programmable receiver in an integrated circuit.

Turning now to FIG. 11, a flow chart shows a method of adjusting an offset of an input signal to a programmable receiver in an integrated circuit. The inputs of an amplifier circuit are coupled to a reference voltage at a block 1102. An initial code to be applied to an offset cancellation circuit is selected to adjust currents in the offset cancellation circuit at a block 1104. The code is sent to the offset cancellation circuit to adjust currents in the offset cancellation circuit at a block 1106. An output of the amplifier circuit is monitored at a block 1108. It is then determined whether the output of the amplifier circuit has transitioned from a logical "0" to a logical "1" or from a logical "1" to a logical "0" at a block 1110. If not, the code to be sent to the offset cancellation circuit is modified at a block 1112. Otherwise, the amplifier circuit is implement using the current code at a block 1114.

Figure 12:
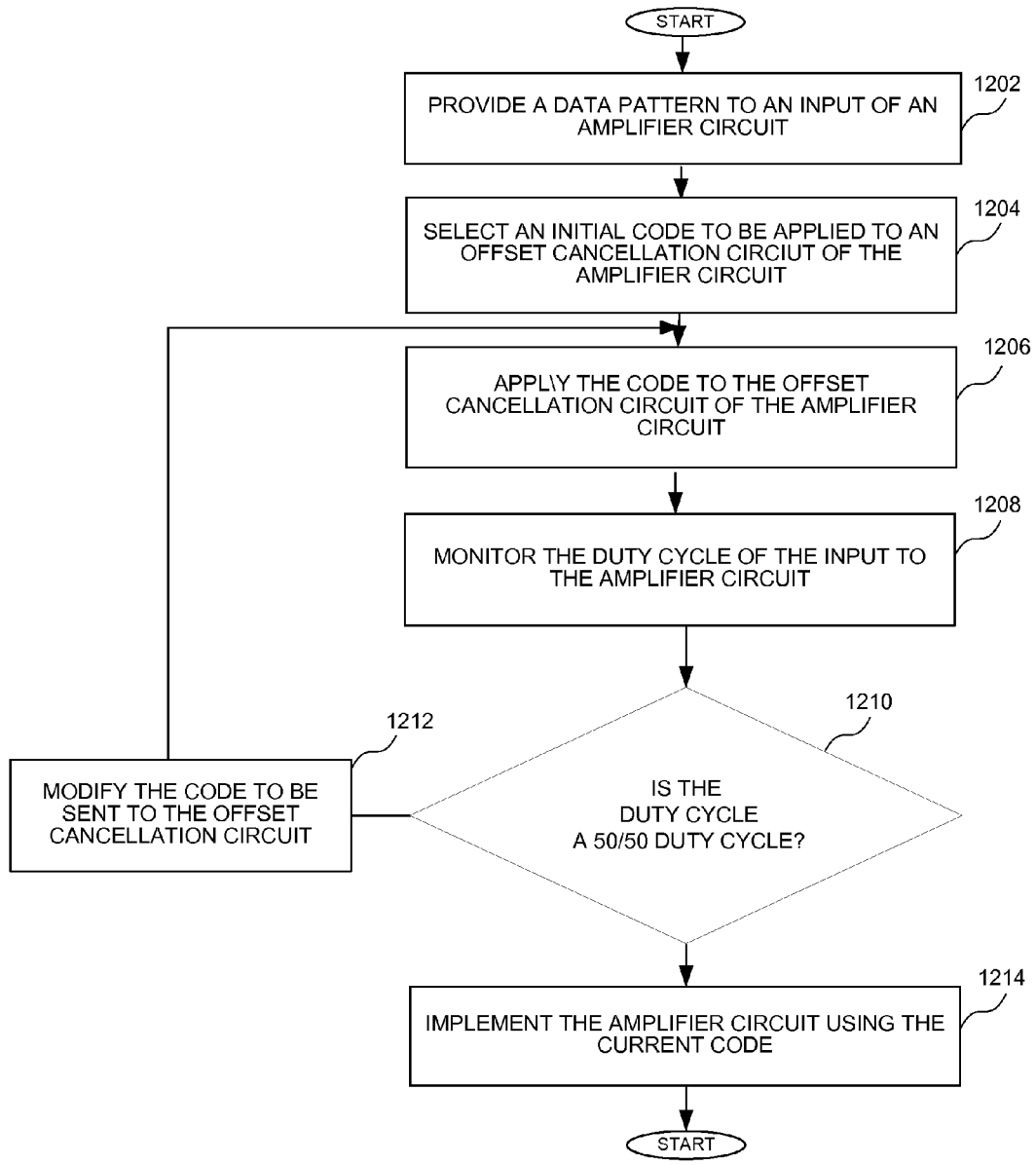
FIG. 12 is a flow chart showing a method of adjusting a duty cycle of an input signal to a programmable receiver in an integrated circuit.

Turning now to FIG. 12, a flow chart shows a method of adjusting a duty cycle of an input signal to a programmable receiver in an integrated circuit. A data pattern is provided to an input of an amplifier circuit at a block 1202. An initial code to be applied to the amplifier circuit is selected at a block 1204. The code is provided to an offset cancellation circuit of the amplifier circuit at a block 1206. The duty cycle monitored at a block 1208. It is then determined whether the duty cycle a 50/50 duty cycle at a block 1210. If not, the code to be sent to the offset cancellation circuit is modified at a block 1212. Otherwise, the amplifier circuit is then implemented using the current control signal at a block 1214.

The various elements of the methods of FIGS. 10-12 may be implemented using the circuits of FIGS. 1-9 as described, or using some other suitable circuits. While specific elements of the method are described, it should be understood that additional elements of the method, or additional details related to the elements, could be implemented according to the disclosure of FIGS. 1-9.

It can therefore be appreciated that the new and novel circuits and methods of implementing a programmable received in an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A programmable receiver implemented in an integrated circuit device, the programmable receiver comprising:
   a pre-amplifier circuit coupled to receive an input signal, the pre-amplifier circuit having a programmable current source; and
   an amplifier circuit coupled to receive an output of the pre-amplifier circuit;
   wherein the pre-amplifier circuit comprises a first conductive path coupled to a first input of the amplifier circuit and a second conductive path coupled to a second input of the amplifier circuit, and the programmable current source controls a current in at least one of the first conductive path or the second conductive path; and
   wherein the programmable current source is coupled to receive a control signal to enable the receiver to be switched between a high performance mode and a low performance mode.

2. The programmable receiver of claim 1 wherein the first conductive path comprises a first multiplexer and the second conductive path comprises a second multiplexer, and the first and second multiplexers select an input associated with a differential receiver or a voltage based receiver.

3. The programmable receiver of claim 1 wherein the amplifier circuit comprises a differential amplifier.

4. The programmable receiver of claim 1 further comprising a second programmable current source associated with the amplifier circuit, wherein the second programmable current source receives the control signal and enables the amplifier circuit to operate in a high performance mode and a low performance mode.

5. The programmable receiver of claim 1 further comprising an offset compensation circuit, wherein the offset compensation circuit controls an offset of the input signal.

6. The programmable receiver of claim 1 further comprising an offset compensation circuit, wherein the offset compensation circuit is implemented to provide a desired duty cycle of the input signal.

7. A programmable receiver implemented in an integrated circuit device, the programmable receiver comprising:
   an amplifier circuit coupled to receive an input signal at an input;
   a detection circuit coupled to an output of the amplifier circuit; and
   an offset cancellation circuit coupled to the input of the amplifier circuit;
   wherein the detection circuit generates a control signal that is coupled to the offset cancellation circuit and is a programmable signal that controls a bias circuit coupled to the input of the amplifier circuit to modify an offset of the input signal.

8. The programmable receiver of claim 7 wherein the control signal is coupled to a control terminal of a transistor for controlling a bias current of the bias circuit.

9. The programmable receiver of claim 7 wherein the detection circuit comprises a pattern check circuit coupled to receive a test pattern.

10. The programmable receiver of claim 9 wherein the detection circuit comprises an offset state machine which determines an offset of the input signal based upon an output of the pattern check circuit.

11. The programmable receiver of claim 9 wherein the detection circuit comprises an duty cycle state machine.

12. The programmable receiver of claim 11 wherein the duty cycle state machine introduces an offset to the input signal to correct a duty cycle error.

13. A method of implementing a programmable receiver in an integrated circuit device, the method comprising:
    receiving an input signal to be amplified at an input of an amplifier circuit; and
    detecting an output of the amplifier circuit;
    coupling an offset cancellation circuit to the input of the amplifier circuit;
    coupling a control signal to the offset cancellation circuit, wherein the control signal is a programmable signal that controls a bias circuit coupled to the input of the amplifier circuit; and
    modifying an offset of the input signal coupled to the amplifier circuit in response to the control signal.

14. The method of claim 13 wherein detecting an output of the amplifier circuit comprises determining an offset of the input signal.

15. The method of claim 13 wherein detecting an output of the amplifier circuit comprises detecting a duty cycle error of the input signal.

16. The method of claim 15 wherein modifying an offset of the input signal coupled to the amplifier circuit in response to the control signal enables modifying a duty cycle of the input signal.

17. The method of claim 13 further comprising selecting a performance level of the amplifier circuit.

18. The method of claim 17 further comprising providing a bias control signal to the amplifier circuit based upon the selected performance level of the amplifier circuit.

* * * * *